United States Patent
Lee et al.

(10) Patent No.: US 8,498,161 B2
(45) Date of Patent: Jul. 30, 2013

(54) NONVOLATILE MEMORY DEVICE AND METHOD OF READING THE SAME

(75) Inventors: Jung Hwan Lee, Seoul (KR); Seong Je Park, Suwon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 193 days.

(21) Appl. No.: 13/183,675

(22) Filed: Jul. 15, 2011

(65) Prior Publication Data

US 2012/0057409 A1 Mar. 8, 2012

(30) Foreign Application Priority Data

Sep. 6, 2010 (KR) .................. 10-2010-0087052

(51) Int. Cl.
*G11C 11/34* (2006.01)

(52) U.S. Cl.
USPC ...................... 365/185.25; 365/203

(58) Field of Classification Search
USPC .............. 365/185.25, 203, 201, 189.05
See application file for complete search history.

(56) References Cited

U.S. PATENT DOCUMENTS 7,133,311 B2 * 11/2006 Liu ............................. 365/168
7,782,674 B2 * 8/2010 Roohparvar et al. ..... 365/185.17

FOREIGN PATENT DOCUMENTS

KR 1020070004295 A 1/2007

* cited by examiner

*Primary Examiner* — Son Dinh
(74) *Attorney, Agent, or Firm* — William Park & Associates Patent Ltd.

(57) ABSTRACT

A read method of a nonvolatile memory device according to an exemplary embodiment of this disclosure includes precharging bit lines coupled to memory cells, performing a first read operation by supplying a first reference voltage to the memory cells in order to determine the data stored in the memory cells, precharging bit lines coupled to undetermined memory cells whose data has not been determined by the first read operation, and performing a second read operation by supplying a second reference voltage to the memory cells in order to determine data stored in the undetermined memory cells.

14 Claims, 12 Drawing Sheets

NONVOLATILE MEMORY DEVICE AND METHOD OF READING THE SAME

CROSS-REFERENCE TO RELATED APPLICATION

Priority is claimed to Korean patent application number 10-2010-0087052 filed on Sep. 6, 2010, the entire disclosure of which is incorporated by reference.

BACKGROUND

Exemplary embodiments relate to a nonvolatile memory device including page buffers and a method of reading the same.

There is an increasing demand for nonvolatile memory devices that can be electrically programmed and erased and which do not require refreshing at specific intervals.

The nonvolatile memory device can be electrically programmed and erased in such a way that electrons within an oxide layer are moved by a strong electric field applied to the oxide layer, thereby shifting threshold voltages of memory cells.

In order to read data stored in the memory cells of the nonvolatile memory device, resetting is performed and the sense node of a page buffer is then precharged to a high level by precharging a bit line.

When the nonvolatile memory device is a multi-level cell ('MLC') program method or a triple level cell (TLC') program method, a read operation is performed twice or more on the basis of different reference voltages.

When the read operation is repeated, the read operation for some of the memory cells is completed according to threshold voltages of the memory cells. In a typical read method of the nonvolatile memory device, precharging is performed for all memory cells every time. That is, such precharging is performed for some of the memory cells that have already been read.

Accordingly, not only is the consumption of an operating current increased, but also a source line bouncing phenomenon occurs where a lot of current flows through a source line according to a cell string coupled to the bit line. Consequently, a problem arises because a threshold voltage distribution of the memory cells is widened.

BRIEF SUMMARY

According to exemplary embodiments, the consumption of an operating current can be reduced and the source line bouncing phenomenon can be alleviated, if not prevented, by efficiently performing precharging in the read operation of a nonvolatile memory device.

In one aspect, a read method of a nonvolatile memory device comprises precharging bit lines coupled to memory cells and performing a first read operation by supplying a first reference voltage to the memory cells to determine the data stored in the memory cells. Bit lines coupled to undetermined memory cells whose data has not been determined by the first read operation are precharged and a second read operation is performed by supplying a second reference voltage to the memory cells in order to determine data stored in the undetermined memory cells.

In another aspect, a read method of a nonvolatile memory device comprises precharging bit lines coupled to memory cells which are classified into first to fourth memory cells, where each memory cell has a different threshold voltage. A first read operation is performed for distinguishing the first and the second memory cells from the third and the fourth memory cells. After precharging the bit lines of the memory cells, a second read operation is performed for distinguishing the first memory cell from the second memory cell. After precharging bit lines coupled to the third and the fourth memory cells, a third read operation is performed for distinguishing the third memory cell from the fourth memory cell.

In another aspect, a read method of a nonvolatile memory device comprises precharging bit lines coupled to memory cells which are classified into first to eighth memory cells, each having a different threshold voltage. A first read operation is performed for distinguishing the first to fourth memory cells from the fifth to eighth memory cells. After precharging the bit lines of the memory cells, a second read operation is performed for distinguishing the first and the second memory cells from the third and the fourth memory cells. After precharging bit lines coupled to the fifth to eighth memory cells, a third read operation is performed for distinguishing the fifth and the sixth memory cells from the seventh and eighth memory cells. After precharging the bit lines of the memory cells, a fourth read operation is performed for distinguishing the first memory cell from the second memory cell. After precharging bit lines coupled to the third and the eighth memory cells, a fifth read operation is performed for distinguishing the third memory cell from the fourth memory cell. After precharging the bit lines of the fifth to the eighth memory cells, a sixth read operation is performed for distinguishing the fifth memory cell from the sixth memory cell. After precharging bit lines coupled to the seventh and the eighth memory cells, a seventh read operation is performed for distinguishing the seventh memory cell from the eighth memory cell.

In a still another aspect, a nonvolatile memory device comprises a memory block comprising memory cells. A plurality of page buffers are coupled to respective bit lines corresponding to the memory cells and are configured to perform a read operation for determining data stored in the memory cells. A control circuit is configured to control the page buffers so that the page buffers perform a first read operation by using a first reference voltage as a read voltage in order to determine the data of the memory cells after precharging a relevant bit line, precharge bit lines coupled to undetermined memory cells whose data has not been determined by the first read operation, and then perform a second read operation.

DESCRIPTION OF EMBODIMENTS

Various exemplary embodiments of the present disclosure will be described in detail with reference to the accompanying drawings. The figures are provided to allow those having ordinary skill in the art to understand the scope of the embodiments of the disclosure.

Figure 1:
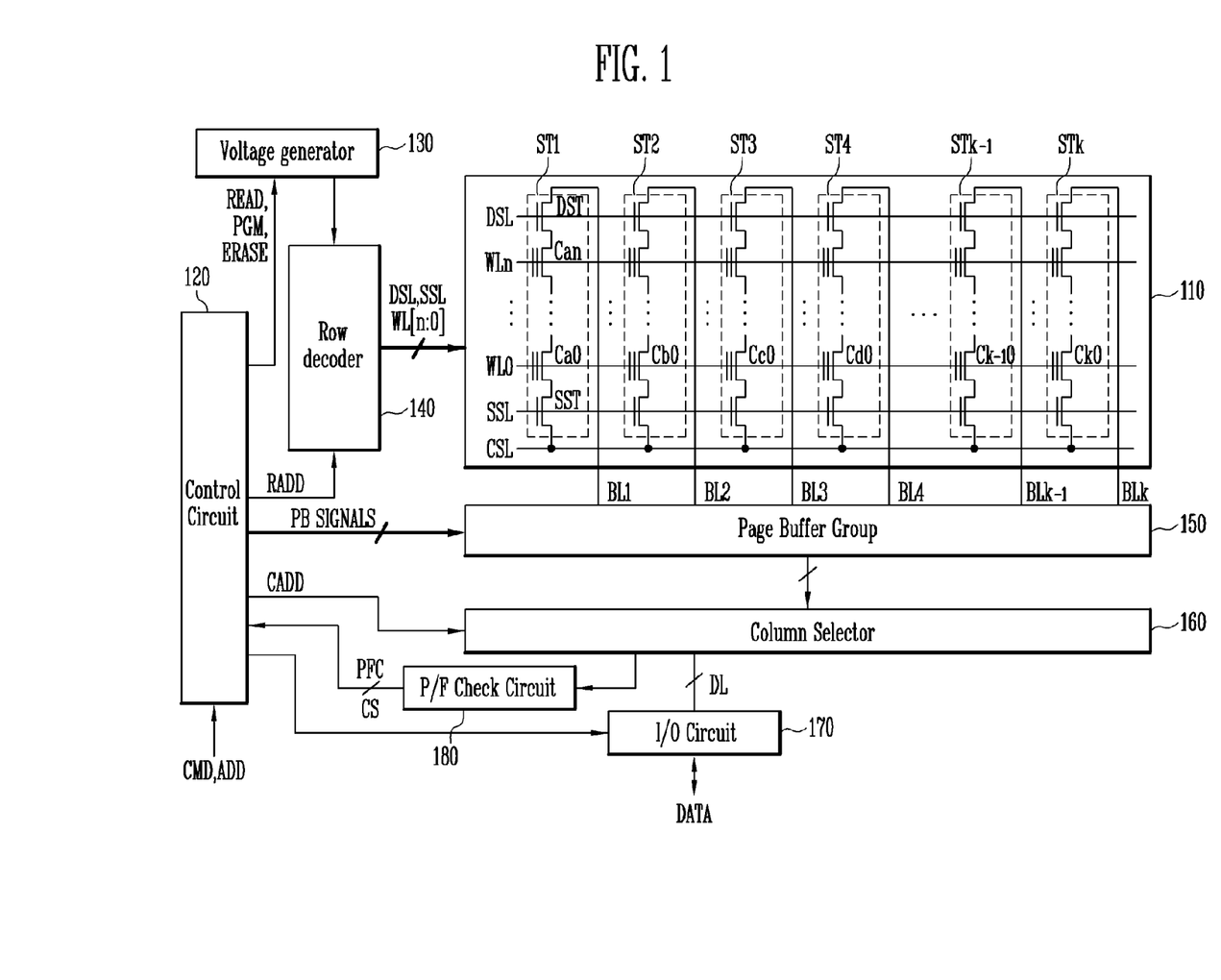
FIG. 1 is a diagram showing a nonvolatile memory device according to an exemplary embodiment of this disclosure.

FIG. 1 is a diagram showing a nonvolatile memory device according to an exemplary embodiment of this disclosure.

Referring to FIG. 1, the nonvolatile memory device according to an exemplary embodiment of this disclosure includes a memory cell block 110 included in a memory cell array, an operation circuit group (130, 140, 150, 160, 170, and 180) configured to perform a read operation for the memory cells of the memory cell block 110, and a control circuit 120 configured to control the operation circuit group (130, 140, 150, 160, 170, and 180).

In the case of a NAND flash memory device, the operation circuit group may include a voltage generator 130, a row decoder 140, a page buffer group 150, a column selector 160, an I/O circuit 170, and a pass/fail (P/F) check circuit 180.

The memory cell array includes a plurality of the memory cell blocks. For ease of description, FIG. 1 shows only memory cell block 110 of a plurality of memory cell blocks that may be present in a nonvolatile memory. The memory cell block 110 includes a plurality of strings ST1 to STk. Each of the strings ST1 to STk includes a source select transistor SST coupled to a common source line CSL, a plurality of memory cells Ca0 to Can, and a drain select transistor DST coupled to a corresponding bit line BL1 to BLk. The gate of the source select transistor SST is coupled to a source select line SSL. The gates of the memory cells Ca0 to Can are coupled to respective word lines WL0 to WLn. The gate of the drain select transistor DST is coupled to a drain select line DSL. The strings ST1 to STk are coupled to the respective bit lines BL1 to BLk and are coupled to the common source line CSL.

The control circuit 120 internally generates a program operation signal PGM, a read operation signal READ, or an erase operation signal ERASE in response to a command signal CMD and also generates control signals PB SIGNALS for controlling the page buffers (not shown) of the page buffer group 150 according to the types of operations. Furthermore, the control circuit 120 internally generates a row address signal RADD and a column address signal CADD in response to an address signal ADD.

The voltage supply circuit (130, 140) supplies the drain select line DSL, the word lines WL0 to WLn, and the source select line SSL of a selected memory cell block, for example, the memory cell block 110, with operating voltages necessary for a read operation for memory cells in response to the read operation signal READ of the control circuit 120. The voltage supply circuit includes the voltage generator 130 and the row decoder 140. The voltage supply circuit (130, 140) supplies a reference voltage for the read operation to the word lines WL0 to WLn.

The voltage generator 130 outputs operating voltages necessary for the read operation for the memory cells to global lines in response to the read operation signal READ of the control circuit 120.

The row decoder 140 transfers the operating voltages of the voltage generator 130 to the strings ST1 to STk of a selected memory cell block, for example, the memory cell block 110, in response to the row address signals RADD of the control circuit 120.

The page buffer group 150 includes the page buffers coupled to the respective bit lines BL1 to BLk. In a read operation, the page buffer group 150 supplies the bit lines BL1 to BLk with respective voltages necessary to read data stored in the memory cells Ca0 to Ck0 in response to the control signals PB SIGNALS of the control circuit 120.

The column selector 160 selects the page buffer of the page buffer group 150 in response to the column address signal CADD of the control circuit 120 and outputs data latched in the page buffer selected by the column selector 160.

During a read operation, the I/O circuit 170 outputs data, received from the page buffer group 150 via the column selector 160, under the control of the control circuit 120.

The P/F check circuit 180 checks whether an error has occurred in a read verification operation performed after the read operation and outputs a result of the check as a check signal PFC. Furthermore, the P/F check circuit 180 performs a function of counting the number of occurred error cells and outputting a result of the count as a count signal CS.

Figure 2A:
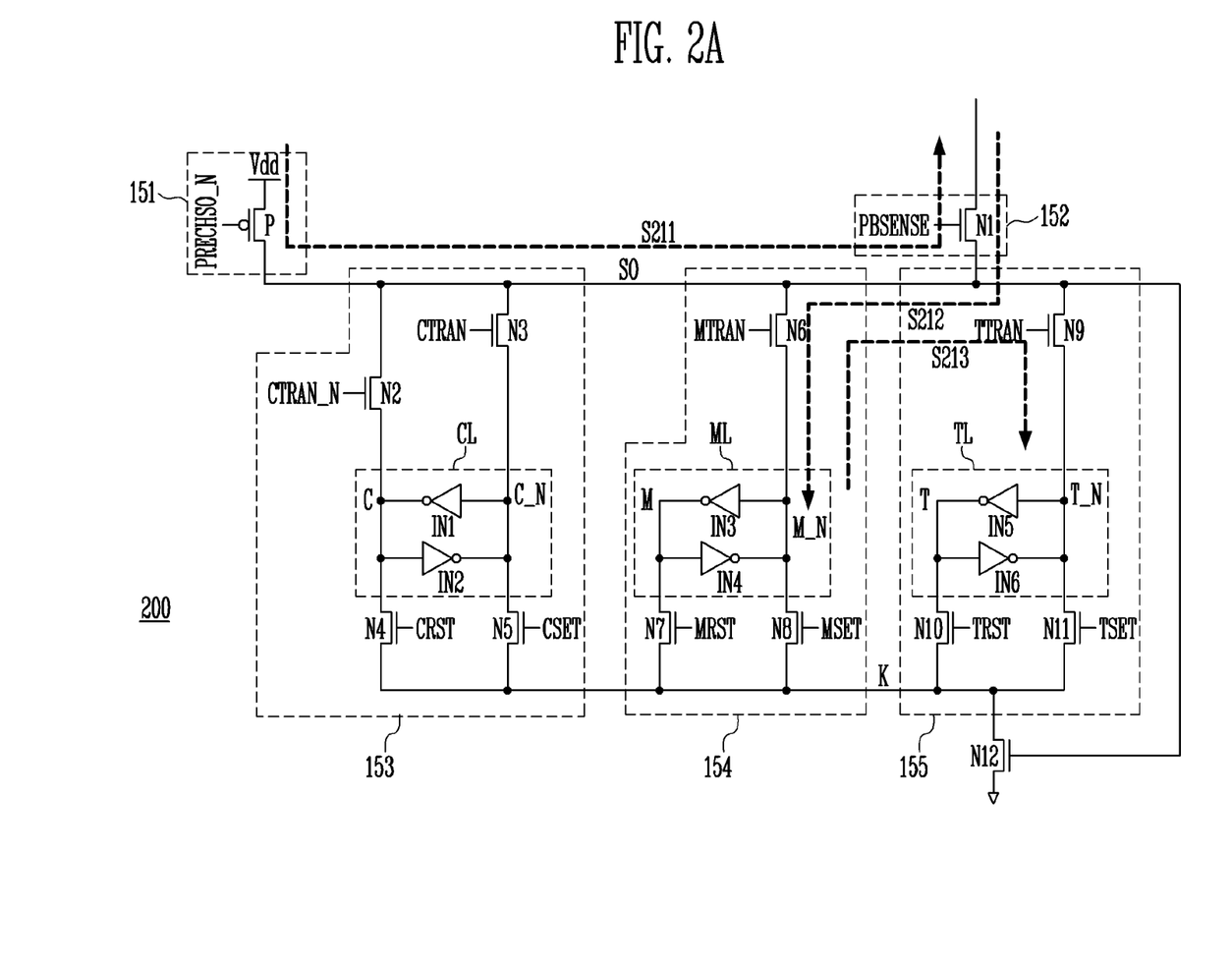
FIGS. 2A and 2B are diagrams illustrating an MSB read operation in the nonvolatile memory device using an MLC program method according to an exemplary embodiment of this disclosure.
Figure 2B:
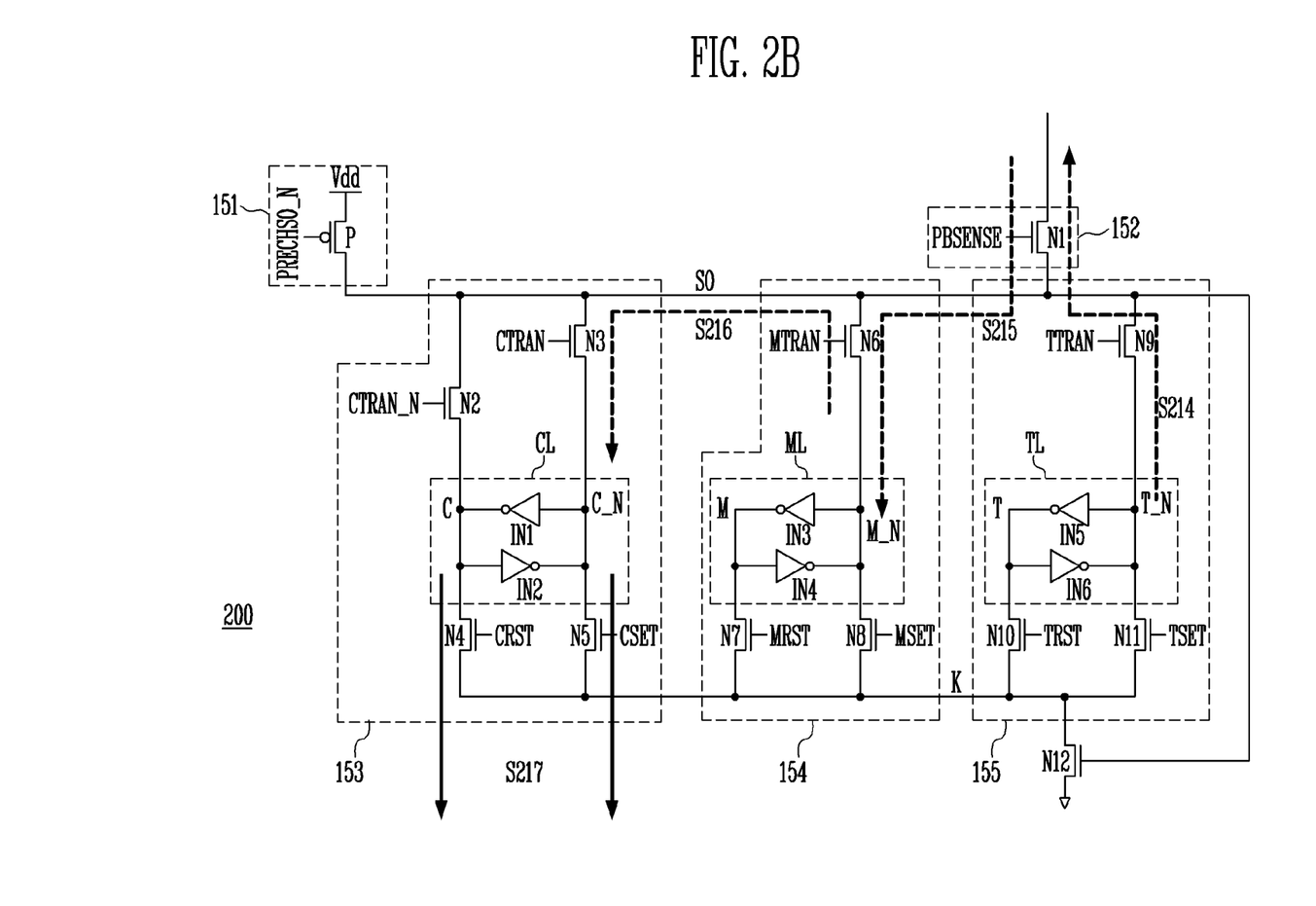
Figure 3:
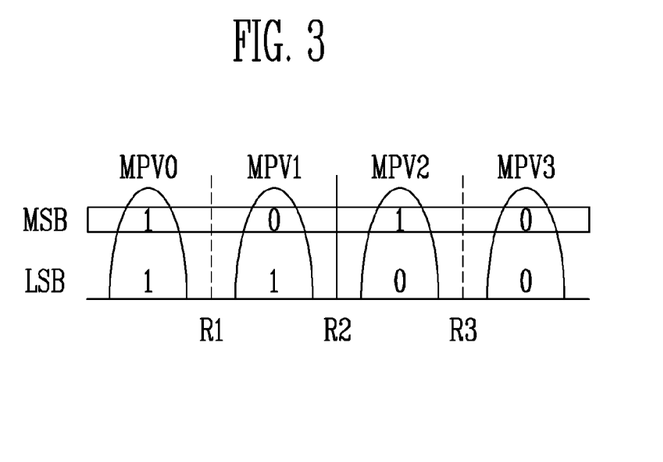
FIG. 3 is a diagram showing the threshold voltage distributions of memory cells in the nonvolatile memory device using the MLC program method according to an exemplary embodiment of this disclosure.

FIGS. 2A and 2B are diagrams showing a page buffer 200 included in the page buffer group 150 of the nonvolatile memory device according to an exemplary embodiment of this disclosure, and are diagrams illustrating an MSB read operation of the nonvolatile memory device using an MLC program method according to an exemplary embodiment of this disclosure. Furthermore, FIG. 3 is a diagram showing the threshold voltage distributions of memory cells in the nonvolatile memory device using the MLC program method according to the exemplary embodiment of this disclosure.

The construction of the page buffer 200 is first described below with reference to FIGS. 2A and 2B.

Referring to FIGS. 2A and 2B, the page buffer 200 includes a precharge unit 151, a sense unit 152, a cache latch unit 153 for receiving read data from a main latch unit 154 and externally outputting the read data, the main latch unit 154 for storing a result of a read operation from memory cells, and a temporary latch unit 155 for receiving the read data from the main latch unit 154 and supplying a precharge voltage.

The precharge unit 151 performs a function of precharging a sense node SO. The precharge unit 151 may be formed of a PMOS transistor P coupled between a terminal Vdd for power source voltage and the sense node SO. A sense node precharge signal PRECHSO_N is inputted to the gate of the PMOS transistor P.

The sense unit 152 is coupled to a bit line selection unit (not shown) for selecting one of a pair of bit lines (an even bit line and an odd bit line). The sense unit 152 may be formed of a first NMOS transistor N1 coupled between the sense node SO and a bit line selected by the bit line selection unit. The sense unit 152 senses program states of memory cells coupled to the bit line selected by the bit line selection unit. A sense signal PBSENSE is inputted to the gate of the first NMOS transistor N1.

The cache latch unit 153, the main latch unit 154, and the temporary latch unit 155 perform a function of reading data programmed into memory cells in response to a voltage of the sense node SO, shifting data when the sense unit 152 senses the program states of the memory cells, and storing the read data.

The cache latch unit 153 includes a cache latch CL including two inverters IN1, IN2. The cache latch CL includes a first node C and a second node C_N that have opposite signal polarities. The first node C and the second node C_N are coupled to the sense node SO through a second NMOS transistor N2 and a third NMOS transistor N3, respectively. Transmission signals CTRAN_N, CTRAN for coupling the sense node SO and the first node C and the second node C_N, respectively, are inputted to the respective gates of the second NMOS transistor N2 and the third NMOS transistor N3. The cache latch unit 153 further includes a fourth NMOS transistor N4 driven in response to a reset signal CRST and configured to reset the first node C of the cache latch CL and a fifth NMOS transistor N5 driven in response to a set signal CSET and configured to reset the node C_N of the cache latch CL.

The main latch unit 154 includes a main latch ML including two inverters IN3, IN4. The main latch ML includes a first node M and a second node M_N that have opposite signal polarities. The second node M_N is coupled to the sense node SO through a sixth NMOS transistor N6. A transmission signal MTRAN is inputted to the gate of the sixth NMOS transistor N6. The main latch unit 154 further includes a seventh NMOS transistor N7 driven in response to a reset signal MRST and configured to reset the first node M of the main latch ML and an eighth NMOS transistor N8 driven in response to a set signal MSET and configured to reset the node M_N of the main latch ML.

The temporary latch unit 155 includes a temporary latch TL including two inverters IN5, IN6. The temporary latch TL includes a first node T and a second node T_N that have opposite signal polarities. The second node T_N is coupled to the sense node SO through a ninth NMOS transistor N9. A transmission signal TTRAN is inputted to the gate of the ninth NMOS transistor N9. The temporary latch unit 155 further includes a tenth NMOS transistor N10 driven in response to a reset signal TRST and configured to reset the first node T of the temporary latch TL and an eleventh NMOS transistor N11 driven in response to a set signal TSET and configured to reset the node T_N of the temporary latch TL.

The page buffer 200 further includes a twelfth NMOS transistor N12 coupled between a node K and a ground and coupled to the sense node SO.

Referring to FIG. 3, in an MLC program method, the threshold voltage distributions of memory cells may have a first level to a fourth level MPV0, MPV1, MPV2, and MPV3. Data stored in the memory cells may have levels '11', '01', '10', and '00'. Each of the levels is with respect to a first reference voltage R1, a second reference voltage R2, and a third reference voltage R3.

In the nonvolatile memory device using the MLC program method, a least significant bit (LSB) read operation is first performed and a most significant bit (MSB) read operation is then performed. Here, the LSB read operation based on the second reference voltage R2 is the same as that of a conventional method, and a description thereof is omitted. The memory cells are classified into memory cells in each of which the by LSB of data stored by the LSB read operation is '1' when a memory cell has the threshold voltage of the first level MPV0 or the second level MPV1, and the LSB of is '0' when a memory cell has the threshold voltage of the third level MPV2 or the fourth level MPV3).

An MSB read operation of the nonvolatile memory device using the MLC program method according to an exemplary embodiment of this disclosure is described below with reference to FIGS. 2A, 2B, and FIG. 3.

The read operation of memory cells is classified into a precharge section in which bit lines are precharged and a section in which program states of the memory cells are read.

An MSB read process for memory cells having the threshold voltage of the first level MPV0 and the second level MPV1 is described below with reference to FIG. 2A.

When the precharge signal PRECHSO_N of a low level is supplied, the PMOS transistor P is turned on, and the sense node SO is precharged to the power source voltage. At this time, when the sense signal PBSENSE having the power source voltage is supplied, the first NMOS transistor N1 is turned on, and the precharge voltage of the sense node SO is transferred to a selected bit line, so that the bit lines are precharged as shown by the arrow labeled S211. Accordingly, all memory cells coupled to the selected bit lines are precharged.

Next, the first reference voltage R1 is supplied to a word line coupled to the memory cells. Accordingly, the memory cells may be classified into memory cells having the threshold voltages of the first level MPV0 and memory cells having the threshold voltages of the second level MPV1, on the basis of the first reference voltage R1. Thus, data corresponding to '11' or '01' stored in the memory cell having the threshold voltage of the first level MPV0 or the memory cell having the threshold voltage of the second level MPV1 is read and transferred to the second node M_N of the main latch ML as shown by the arrow labeled S212. At this time, the sixth NMOS transistor N6 may be turned on in response to the transmission signal MTRAN of a high level.

Next, the read data of the second node M_N is transferred to the second node T_N of the temporary latch TL as shown by the arrow S213. At this time, the second node M_N of the main latch ML and the second node T_N of the temporary latch TL may be coupled to the sense node SO in response to the respective transmission signals MTRAN, TTRAN of a high level.

An MSB read process in which the read operation described with reference to FIG. 2A is performed and the memory cells are classified into memory cells having the threshold voltages of the third level MPV2 and memory cells having the threshold voltages of the fourth level MPV3, is described below with reference to FIG. 2B. The classification of the memory cells into the memory cells having the threshold voltages of the second level MPV1 and the memory cells having the threshold voltages of the third level MPV2 has already been performed in the LSB read operation, and so need not be performed when the MSB read operation is performed.

Referring to FIG. 2B, as shown by arrow S214, bit lines are precharged using the data transferred to the second node T_N of the temporary latch TL as shown by the arrow S213 of FIG. 2A. At this time, the first NMOS transistor N1 is turned on in response to the sense signal PBSENSE having the power source voltage, and the ninth NMOS transistor N9 is turned on in response to the transmission signal TTRAN of a high level. Since the bit lines are precharged using the data read as a result of the read operation based on the first reference voltage R1, memory cells, having lower threshold voltages than memory cells with threshold voltages lower than the second level MPV1 are not precharged. The precharge operation may be performed after the discharge operation.

In the read operation described with reference to FIG. 2A, only bit lines coupled to memory cells having the threshold voltages of the second level MPV1 or less are discharged, but bit lines coupled to the memory cells having the threshold voltages of the third level MPV2 or the fourth level MPV3 are not discharged. Accordingly, it may be said that the precharge operation shown by the arrow S214 is performed to precharge the bit lines coupled to the memory cells not discharged in the read operation described with reference to FIG. 2A.

Next, the third reference voltage R3 is supplied to a word line coupled to the memory cells. Thus, the memory cells may be classified into memory cells having the threshold voltages of the third level MPV2 lower than the third reference voltage R3, and memory cells having the threshold voltages of the fourth level MPV3 higher than the third reference voltage R3. Data corresponding to '10' or '00' stored in the classified memory cells is read and transferred to the second node M_N of the main latch ML as shown by arrow S215. At this time, the sixth NMOS transistor N6 may be turned on in response to the transmission signal MTRAN of a high level.

Next, the read data of the second node M_N of the main latch ML is transferred to the second node C_N of the cache latch CL as shown by arrow S216. At this time, the second node M_N of the main latch ML and the second node C_N of the cache latch CL may be coupled to the sense node SO in response to the respective transmission signals MTRAN, CTRAN of a high level. After the read operation based on the third reference voltage R3 is performed, the read data of the second node M_N of the main latch ML is not transferred to the temporary latch TL because the bit lines need not to be further precharged.

The data of the cache latch CL is transferred to the I/O circuit 170 through the column selector 160 and then externally output as shown by arrow S217.

According to this disclosure, when a read operation is performed while raising a reference voltage, bit lines are precharged using data read in a previous step. Thus, memory cells whose data has already been determined by a previous read operation are not precharged. Accordingly, since all bit lines coupled to memory cells need not to be precharged every time, an operating current can be reduced, and the source line (CSL) bouncing phenomenon in which a lot of current flows through a source line CSL according to a cell string coupled to the bit line can be alleviated.

Figure 4A:
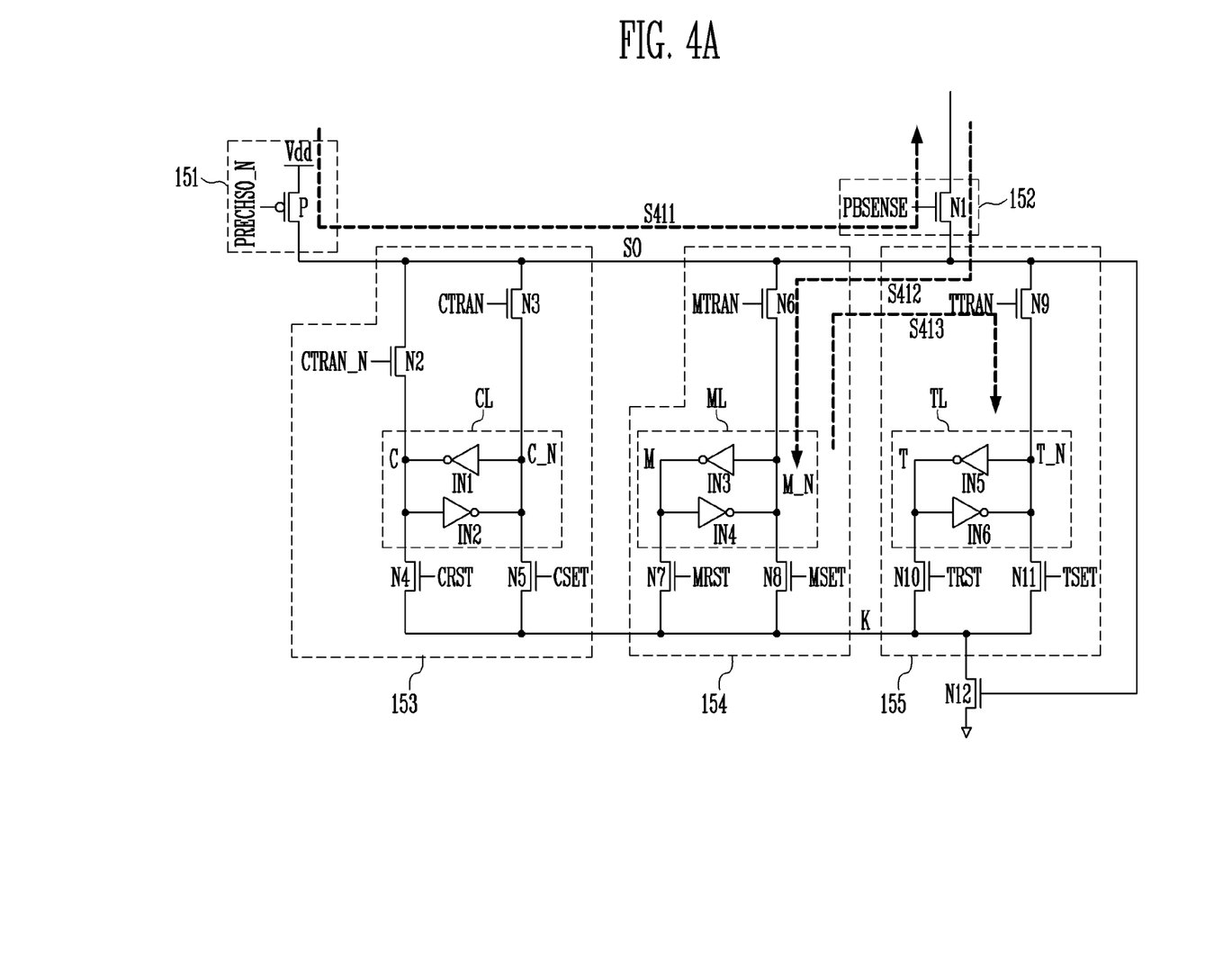
FIGS. 4A and 4B are diagrams illustrating a CSB read operation in the nonvolatile memory device using a TLC program method according to an exemplary embodiment of this disclosure.
Figure 4B:
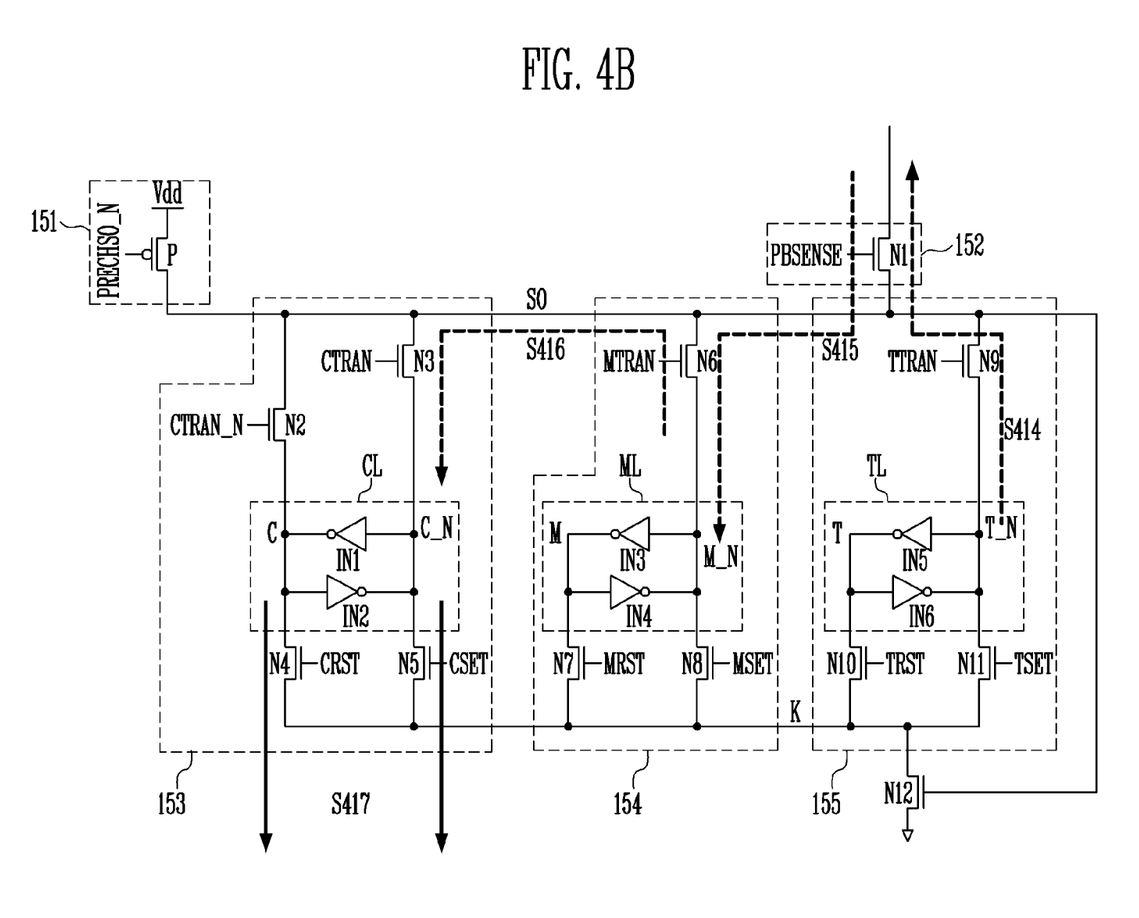
Figure 5:
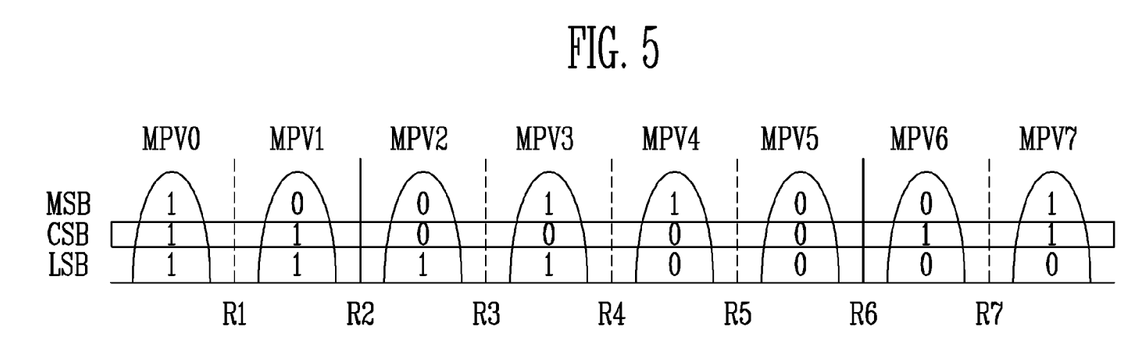
FIG. 5 is a diagram showing the threshold voltage distributions of memory cells in the nonvolatile memory device using the TLC program method according to an exemplary embodiment of this disclosure.

FIGS. 4A and 4B are diagrams showing one of the page buffers included in the page buffer group 150 of the nonvolatile memory device according to the exemplary embodiment of this disclosure and are diagrams illustrating a center significant bit (CSB) read operation in the nonvolatile memory device using a TLC program method according to an exemplary embodiment of this disclosure. FIG. 5 is a diagram showing the threshold voltage distributions of memory cells in the nonvolatile memory device using the TLC program method according to the exemplary embodiment of this disclosure.

Referring to FIG. 5, in the TLC program method, the threshold voltages of memory cells may have first to eighth levels MPV0, MPV1, MPV2, MPV3, MPV4, MPV5, MPV6, and MPV7. Three bit data stored in the memory cells are '111', '011', '001', '101', '100', '000', '010', and '110'. The CSB of data stored in the memory cell is '1' when a threshold voltage of the memory cell has the first level MPV0 or the second level MPV1 which is lower than a second reference voltage R2, '0' when the threshold voltage of the memory cell has the third to sixth levels MPV2 to MPV5 which are higher than the second reference voltage R2, but lower than a sixth reference voltage R6, and '1' when the threshold voltage of the memory cell has the seventh level MPV6 or the eighth level MPV7, which are higher than the sixth reference voltage R6.

In the nonvolatile memory device using the TLC program method, an LSB read operation, a CSB read operation, and an MSB read operation are sequentially performed. Here, the LSB read operation performed in a read operation based on a fourth reference voltage R4 is the same as a conventional LSB read operation, and a description thereof is omitted. Through the LSB read operation, memory cells may be classified into memory cells having the threshold voltages of the first to fourth levels MPV0 to MPV3 and cells having the threshold voltages of the fifth to eighth levels MPV4 to MPV7.

The CSB read operation of the nonvolatile memory device using the TLC program method according to the exemplary embodiment of this disclosure is described below with reference to FIGS. 4A and 4B and FIG. 5.

First, a CSB read process for classifying the memory cells into memory cells having the threshold voltages of the first level MPV0 or the second level MPV1 in which the CSB of data stored in the memory cell is '0' and memory cells having the threshold voltages of the third level MPV2 or the fourth level MPV3 in which the CSB of data stored in the memory cell is '1' is described with reference to FIG. 4A.

When the precharge signal PRECHSO_N of a low level is supplied, the PMOS transistor P is turned on, and the sense node SO is precharged to the power source voltage. At this time, since the sense signal PBSENSE having the power source voltage is supplied, the first NMOS transistor N1 is turned on, and the precharge voltage of the sense node SO is transferred to a selected bit line. Thus, the selected bit line is precharged as shown by arrow S411. In this case, all memory cells coupled to the selected bit line are precharged.

Next, the second reference voltage R2 is supplied to a word line coupled to the memory cells. The memory cells are classified into memory cells having the threshold voltages of the first level MPV0 or the second level MPV1 which is lower than the second reference voltage R2 and memory cells having the threshold voltages of the third level MPV2 or the fourth level MPV3. Data stored in the relevant memory cell is read and transferred to the second node M_N of the main latch ML as shown by arrow S412. At this time, the sixth NMOS transistor N6 may be turned on in response to the transmission signal MTRAN of a high level.

Next, the read data of the second node M_N is transferred to the second node T_N of the temporary latch TL as shown by arrow S413. At this time, the second node M_N of the main latch ML and the second node T_N of the temporary latch TL may be coupled to the sense node SO in response to the respective transmission signals MTRAN, TTRAN of a high level.

FIG. 4B is a diagram illustrating a CSB read operation performed after the CSB read process described with reference to FIG. 4A, and to classify the memory cells into memory cells having the threshold voltages of the fifth level MPV4 or the sixth level MPV5 and memory cells having the threshold voltage of the seventh level MPV6 or the eighth level MPV7.

Referring to FIG. 4B, as shown by arrow 414 bit lines are precharged using the data, transferred to the second node T_N of the temporary latch TL as shown by arrow S413 of FIG. 4A. At this time, the first NMOS transistor N1 is turned on in response to the sense signal PBSENSE having the power source voltage, and the ninth NMOS transistor N9 is turned on in response to the transmission signal TTRAN of a high level.

Since the bit lines are precharged using the data read as a result of the read operation based on the second reference voltage R2, the memory cells having the threshold voltages of the fourth level MPV3 (that is, an upper level from among the threshold voltage levels of the memory cells classified by the read operation) or less are not precharged.

In the read operation described with reference to FIG. 4A, only bit lines coupled to the memory cells having the threshold voltages of the fourth level MPV3 or less are discharged, but bit lines coupled to the memory cells having the threshold voltages of the fifth level MPV4 to the eighth level MPV7 are not discharged. Accordingly, it may be said that the precharge operation shown by arrow S414 is performed to precharge the bit lines coupled to the memory cells not discharged in the read operation described with reference to FIG. 4A.

Next, the sixth reference voltage R6 is supplied to a word line coupled to the memory cells. Thus, the memory cells may be classified into memory cells having threshold voltages lower than the sixth reference voltage R6 and memory cells having threshold voltages higher than the sixth reference voltage R6. Data stored in each of the memory cells is read and transferred to the second node M_N of the main latch ML as shown by arrow S415. At this time, the sixth NMOS transistor N6 may be turned on in response to the transmission signal MTRAN of a high level.

Next, the read data of the second node M_N of the main latch ML is transferred to the second node C_N of the cache latch CL as shown by arrow S416. At this time, the second node M_N of the main latch ML and the second node C_N of the cache latch CL may be coupled to the sense node SO in response to the respective transmission signals MTRAN, CTRAN of a high level. After the read operation based on the sixth reference voltage R6 is performed, the bit lines need not to be further precharged. Accordingly, the read data of the second node M_N of the main latch ML is not transferred to the temporary latch TL.

The data of the cache latch CL is transferred to the I/O circuit 170 through the column selector 160 and then externally outputted a shown by arrow S417.

When the read operation based on the sixth reference voltage R6 is performed, memory cells having the threshold voltages of the first to fourth levels MPV0 to MPV3 are not precharged. Accordingly, an operating current can be reduced, and the source line (CSL) bouncing phenomenon can be alleviated.

Figure 6A:
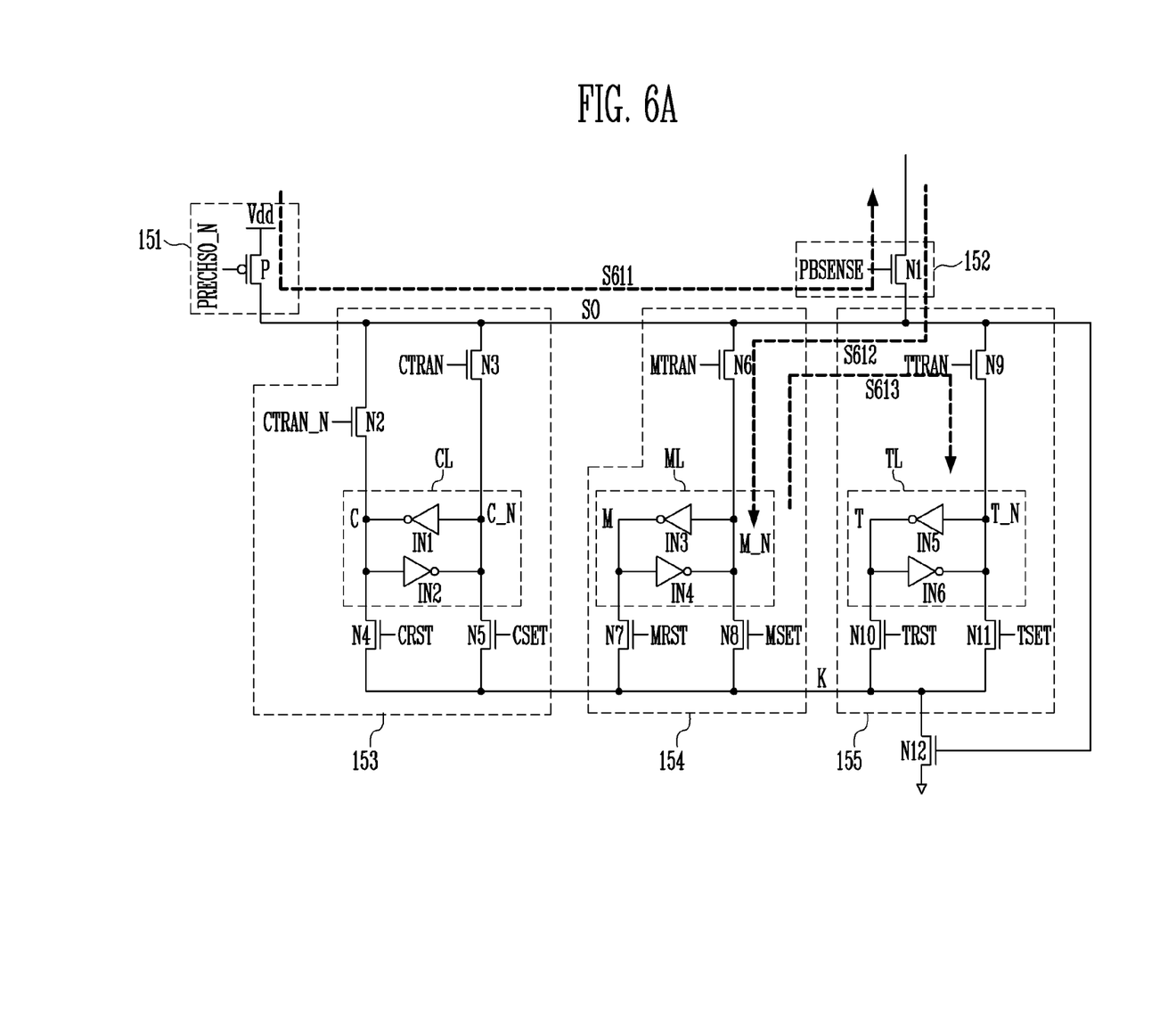
FIGS. 6A to 6D are diagrams illustrating an MSB read operation in the nonvolatile memory device using the TLC program method according to an exemplary embodiment of this disclosure.

FIGS. 6A to 6D are diagrams showing one of the page buffers included in the page buffer group 150 of the nonvolatile memory device according to the exemplary embodiment of this disclosure, and illustrate an MSB read operation in the nonvolatile memory device using the TLC program method according to an exemplary embodiment of this disclosure. FIG. 7 is a diagram showing the threshold voltage distributions of memory cells in the nonvolatile memory device using the TLC program method according to the exemplary embodiment of this disclosure.

Referring to FIG. 7, in the threshold voltage distributions of memory cells according to the TLC program method, the MSB of the memory cell is '1' when a threshold voltage of the memory cell has a first level MPV0 lower than a first reference voltage R1, '0' when the threshold voltage of the memory cell has a second level MPV1 or a third level MPV2 higher than the first reference voltage R1, but lower than a third reference voltage R3, '1' when the threshold voltage of the memory cell has a fourth level MPV3 or a fifth level MPV4 higher than the third reference voltage R3, but lower than a fifth reference voltage R5, '0' when the threshold voltage of the memory cell has a sixth level MPV5 or a seventh level MPV6 higher than the fifth reference voltage R5, but lower than a seventh reference voltage R7, and '1' when the threshold voltage of the memory cell has an eighth level MPV7 higher than the seventh reference voltage R7.

The MSB read operation of the nonvolatile memory device using the TLC program method according to the exemplary embodiment is described below with reference to FIGS. 6A to 6D and FIG. 7.

First, an MSB read process for memory cells corresponding to the first level MPV0 of FIG. 7 is described below with reference to FIG. 6A. A bit line precharging operation (as shown by arrow S611) has been described above, and a detailed description is therefore omitted. In this case, all memory cells coupled to the selected bit line are precharged.

Next, the first reference voltage R1 is supplied to a word line coupled to the memory cells. Thus, the memory cells are classified into memory cells having the threshold voltages of the first level MPV0 and memory cells having the threshold voltages of the second level MPV1. Data stored in the relevant memory cell is read and transferred to the second node M_N of the main latch ML as shown by arrow S612. The memory cells having the threshold voltages of the second level MPV1 and the memory cells having the threshold voltages higher than the second level MPV1 may be classified by the above LSB read operation and the above CSB read operation.

Next, the read data of the second node M_N is transferred to the second node T_N of the temporary latch TL as shown by arrow S613.

Figure 6B:
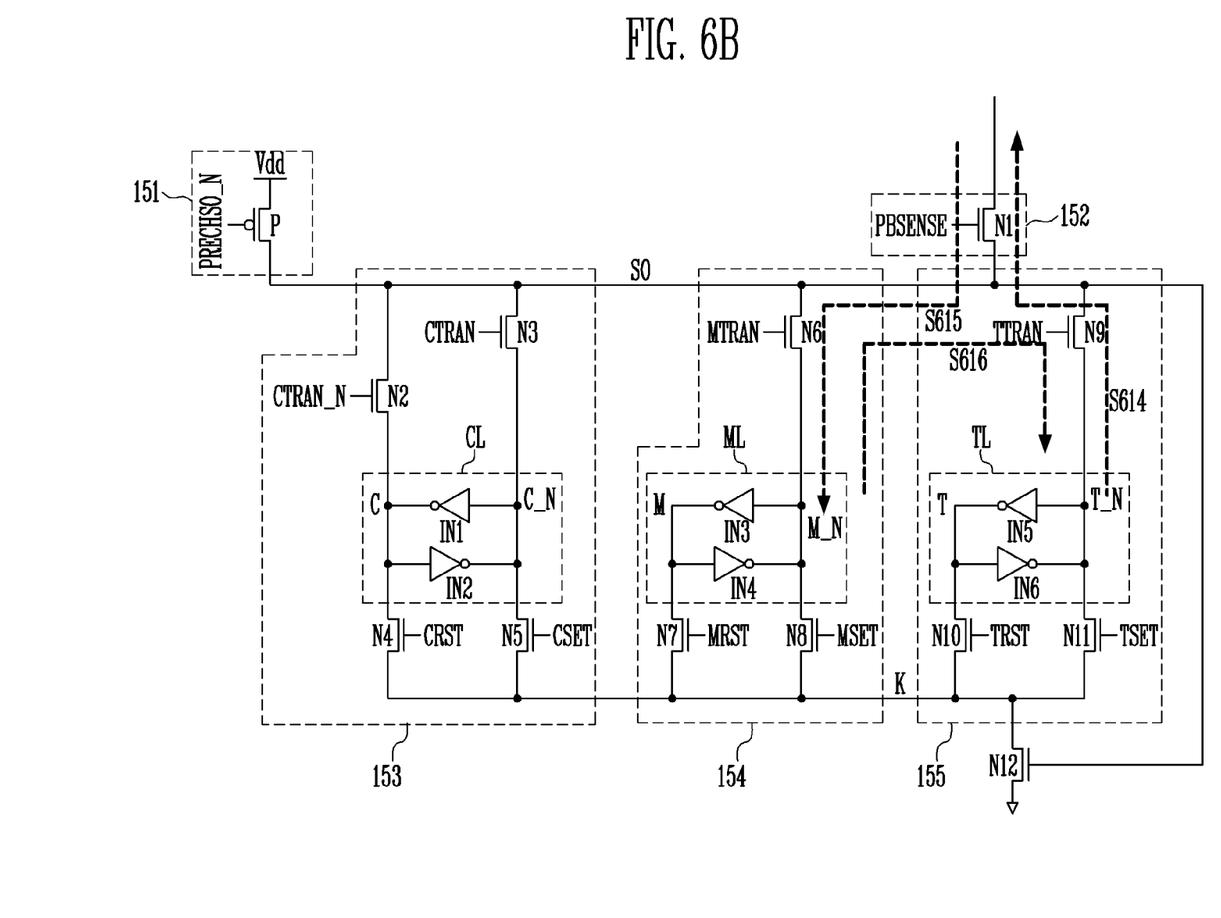
Figure 7:
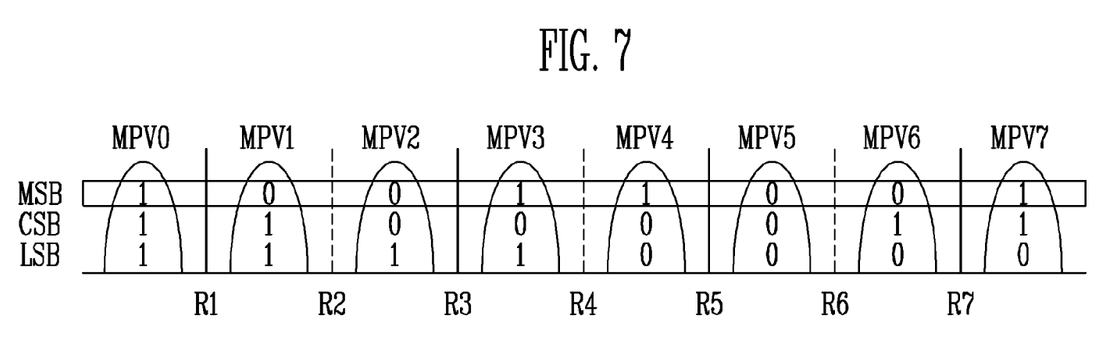
FIG. 7 is a diagram showing the threshold voltage distributions of memory cells in the nonvolatile memory device using the TLC program method according to an exemplary embodiment of this disclosure.

FIG. 6B is a diagram illustrating the MSB read operation performed after the MSB read process described with reference to FIG. 6A and performed to classify the memory cells into the memory cells having the threshold voltages of the third level MPV2 and the memory cells having the threshold voltages of the fourth level MPV3.

First, bit lines are precharged using the data, transferred to the second node T_N of the temporary latch TL as shown by the arrow S613 of FIG. 6A, and arrow S614. Since the bit lines are precharged using the data read as a result of the read operation based on the first reference voltage R1, the memory cells having the threshold voltages of the second level MPV1 or less (that is, the threshold voltages of memory cells read as a result of the read operation) are not precharged, but only the memory cells having the threshold voltages of the third to eighth levels MPV2 to MPV7 are precharged. The precharge operation may be performed after the discharge operation. In this case, it may be said that the bit lines coupled to the memory cells not precharged in the read operation described with reference to FIG. 6A are now precharged.

Next, the third reference voltage R3 is supplied to a word line coupled to the memory cells. Thus, the memory cells are classified into memory cells having the threshold voltages threshold voltage of the third level MPV2 and memory cells having the threshold voltages of the fourth level MPV3. Data stored in the relevant memory cell is read and transferred to the second node M_N of the main latch ML as shown by arrow S615. Memory cells having the threshold voltages of the fourth level MPV3 and memory cells having the threshold voltages higher than the fourth level MPV3 may be classified by the above LSB read operation and the above CSB read operation.

Next, the data of the second node M_N is transferred to the second node T_N of the temporary latch TL as shown by arrow S616.

Figure 6C:
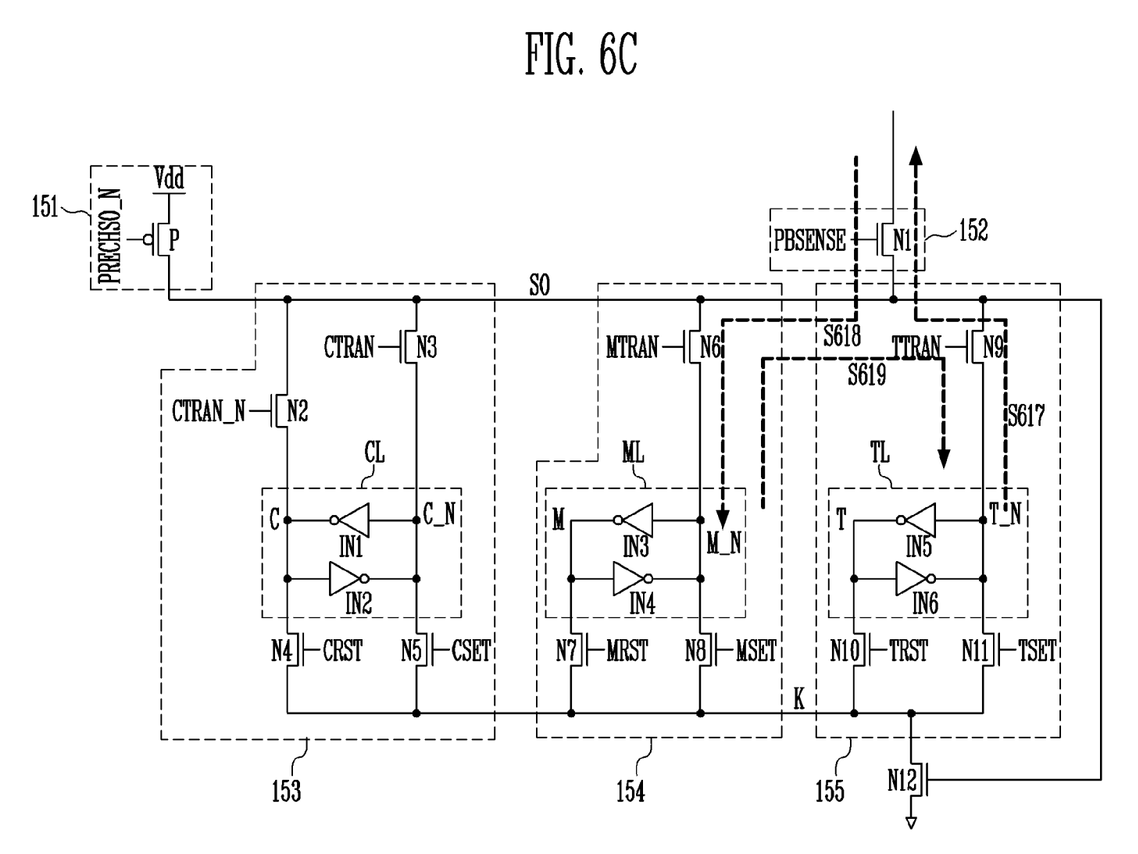

FIG. 6C is a diagram illustrating the MSB read operation performed after the read operation described with reference to FIG. 6B and performed to classify the memory cells into memory cells having the threshold voltages of the fifth level MPV4 and the memory cells having the threshold voltages of the sixth level MPV5.

First, bit lines are precharged using the data, transferred to the second node T_N of the temporary latch TL as shown by the arrow S616 of FIG. 6B, and by arrow S617. Since the bit lines are precharged using the data read as a result of the read operation based on the third reference voltage R3, memory cells having the threshold voltages of the fourth level MPV3 or less (that is, the threshold voltages of memory cells read as a result of the read operation) are not precharged, but only memory cells having the threshold voltages of the fifth to eighth levels MPV4 to MPV7 are precharged In this case, it may be said that the bit lines coupled to the memory cells not discharged in the read operation described with reference to FIG. 6B are precharged.

Next, the fifth reference voltage R5 is supplied to a word line coupled to the memory cells. Thus, the memory cells are classified into memory cells having the threshold voltages of the fifth level MPV4 and memory cells having the threshold voltages of the sixth level MPV5. Data stored in the relevant memory cell is read and transferred to the second node M_N of the main latch ML as shown by arrow S618. The memory cells having the threshold voltages of the sixth level MPV5 and the memory cells having the threshold voltages higher than the sixth level MPV5 may be classified by the above LSB read operation and the above CSB read operation.

Next, the data of the second node M_N is transferred to the second node T_N of the temporary latch TL as shown by arrow S619.

Figure 6D:
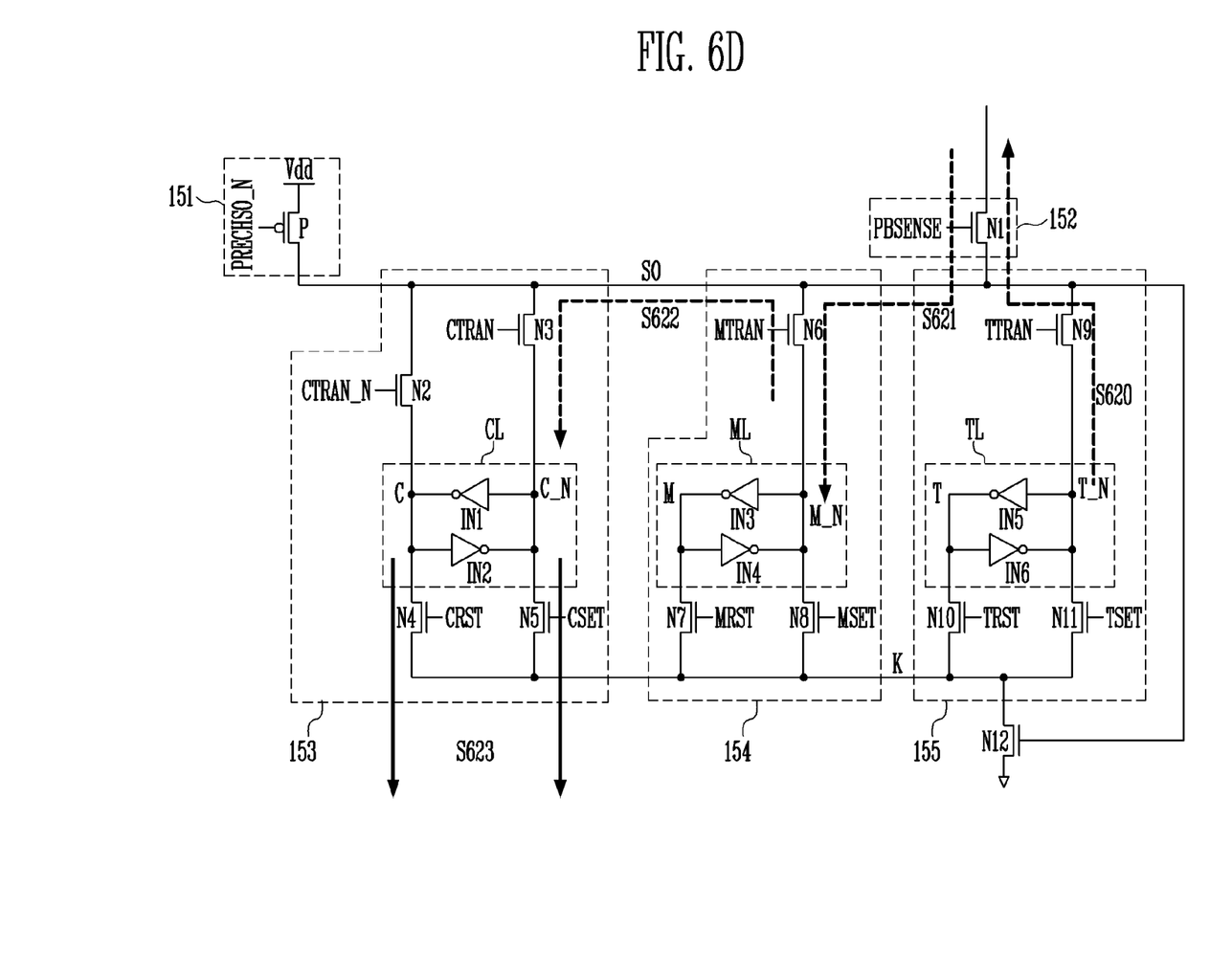

FIG. 6D is a diagram illustrating the MSB read operation performed after the read operation described with reference to FIG. 6C and performed to classify the memory cells into memory cells having the threshold voltages of the seventh level MPV6 and memory cells having the threshold voltages of the eighth level MPV7.

First, bit lines are precharged using the data, transferred to the second node T_N of the temporary latch TL as shown by the arrow S619 of FIG. 6C, as shown by arrow S620. Since the bit lines are precharged using the data read as a result of the read operation based on the fifth reference voltage R5, memory cells having the threshold voltages of the sixth level MPV6 or less (that is, the threshold voltages of memory cells read as a result of the read operation) are not precharged, but only memory cells having the threshold voltages of the seventh or eighth level MPV6 or MPV7 are precharged. In this case, it may be said that the bit lines coupled to the memory cells not discharged in the read operation described with reference to FIG. 6B are precharged.

Next, the seventh reference voltage R7 is supplied to a word line coupled to the memory cells. Thus, the memory cells are classified into memory cells having the threshold voltages of the seventh level MPV6 and memory cells having the threshold voltages of the eighth level MPV7. Data stored in the relevant memory cell is read and transferred to the second node M_N of the main latch ML as shown by arrow S621.

Next, the read data of the second node M_N of the main latch ML is transferred to the second node C_N of the cache latch CL as shown by arrow S622. After the read operation based on the seventh reference voltage R7 is performed, the bit lines need not to be further precharged. Accordingly, the read data of the second node M_N of the main latch ML is not transferred to the temporary latch TL.

The data of the cache latch CL is transferred to the I/O circuit 170 through the column selector 160 and then externally outputted as shown by arrow S623.

Memory cells whose data has already been determined by a read operation are not precharged in a subsequent read operation. Accordingly, an operating current can be reduced, and the source line (CSL) bouncing phenomenon can be alleviated.

The read operation for the nonvolatile memory device using the MLC program method of storing data of 2 bits per memory cell or using the TLC program method of storing data of 3 bits per memory cell has been described above. However, the present disclosure may be applied to a read operation for a nonvolatile memory device using a program method of storing data of 4 bits or more.

According to some embodiments, memory cells whose data has already been determined are not precharged in a subsequent read operation. Accordingly, operating current can be reduced, and the source line (CSL) bouncing phenomenon can be alleviated.

What is claimed is:

1. A read method of a nonvolatile memory device, the method comprising:
   precharging bit lines coupled to memory cells;
   performing a first read operation by supplying a first reference voltage to the memory cells in order to determine data stored in the memory cells;
   precharging bit lines coupled to undetermined memory cells whose data has not been determined by the first read operation; and
   performing a second read operation by supplying a second reference voltage to the memory cells in order to determine data stored in the undetermined memory cells.

2. The read method of claim 1, wherein precharging the bit lines after performing the first read operation includes precharging bit lines coupled to memory cells having threshold voltages higher than the first reference voltage.

3. The read method of claim 1, wherein precharging the bit lines after performing the first read operation includes:
   discharging the bit lines; and
   precharging bit lines not discharged in the first read operation.

4. A read method of a nonvolatile memory device, the method comprising:
   precharging bit lines coupled to memory cells which are classified into first to fourth memory cells, each having a different threshold voltage;
   performing a first read operation for distinguishing the first and the second memory cells from the third and the fourth memory cells;
   after precharging the bit lines of the memory cells, performing a second read operation for distinguishing the first memory cell from the second memory cell; and
   after precharging bit lines coupled to the third and the fourth memory cells, performing a third read operation for distinguishing the third memory cell from the fourth memory cell.

5. The read method of claim 4, wherein the bit lines of the third and the fourth memory cells are not discharged in the second read operation.

6. A read method of a nonvolatile memory device, the method comprising:
   precharging bit lines coupled to memory cells which are classified into first to eighth memory cells, each having a different threshold voltage, and then performing a first read operation for distinguishing the first to fourth memory cells from the fifth to eighth memory cells;
   after precharging the bit lines of the memory cells, performing a second read operation for distinguishing the first and the second memory cells from the third and the fourth memory cells;
   after precharging bit lines coupled to the fifth to eighth memory cells, performing a third read operation for distinguishing the fifth and the sixth memory cells from the seventh and eighth memory cells;

after precharging the bit lines of the memory cells, performing a fourth read operation for distinguishing the first memory cell from the second memory cell;

after precharging bit lines coupled to the third and the eighth memory cells, performing a fifth read operation for distinguishing the third memory cell from the fourth memory cell;

after precharging the bit lines of the fifth to the eighth memory cells, performing a sixth read operation for distinguishing the fifth memory cell from the sixth memory cell; and after precharging bit lines coupled to the seventh and the eighth memory cells, performing a seventh read operation for distinguishing the seventh memory cell from the eighth memory cell.

7. The read method of claim 6, wherein the bit lines of the fifth to eighth memory cells are not discharged in the second read operation or the fifth read operation.

8. The read method of claim 6, wherein the bit lines of the third to eighth memory cells are not discharged in the fourth read operation.

9. The read method of claim 6, wherein the bit lines of the seventh and the eighth memory cells are not discharged in the sixth read operation.

10. A nonvolatile memory device, comprising:
a memory block comprising memory cells;
a plurality of page buffers coupled to respective bit lines corresponding to the memory cells and configured to perform a read operation for determining data stored in the memory cells; and
a control circuit configured to control the page buffers so that the page buffers perform a first read operation by using a first reference voltage as a read voltage in order to determine the data of the memory cells after precharging a relevant bit line, precharge bit lines coupled to undetermined memory cells whose data has not been determined by the first read operation, and then perform a second read operation.

11. The nonvolatile memory device of claim 10, wherein the undetermined memory cells have threshold voltages higher than the first reference voltage.

12. The nonvolatile memory device of claim 10, wherein the bit lines of the undetermined memory cells are not discharged in the first read operation.

13. The nonvolatile memory device of claim 10, wherein:
each of the page buffers comprises a cache latch unit, a main latch unit, and a temporary latch unit,
data determined by the first read operation is transferred to the temporary latch unit through the main latch unit, and
the bit lines of the undetermined memory cells are selectively precharged in response to the data transferred to the temporary latch unit.

14. The nonvolatile memory device of claim 10, wherein the control circuit controls the page buffers so that the page buffers externally output results of the second read operation.

* * * * *